United States Patent [19]

Nakayama et al.

[11] Patent Number: 5,601,961
[45] Date of Patent: Feb. 11, 1997

[54] HIGH-SENSITIVITY POSITIVE-WORKING PHOTORESIST COMPOSITION

[75] Inventors: Kazuhiko Nakayama; Taku Nakao; Kousuke Doi; Nobuo Tokutake; Hidekatsu Kohara; Toshimasa Nakayama, all of Kanagawa-ken, Japan

[73] Assignee: Tokyo Ohka Kogyo Co., Ltd., Japan

[21] Appl. No.: 412,889

[22] Filed: Mar. 29, 1995

[30] Foreign Application Priority Data

Mar. 29, 1994 [JP] Japan ................................. 6-059490

[51] Int. Cl.$^6$ ........................................................ G03F 7/023
[52] U.S. Cl. ............................ 430/192; 430/191; 430/193
[58] Field of Search ..................................... 430/165, 192, 430/193, 191

[56] References Cited

U.S. PATENT DOCUMENTS

| | | | |
|---|---|---|---|
| 4,988,601 | 1/1991 | Ushirogouchi et al. | 430/192 |
| 5,302,490 | 4/1994 | Fedynyshyn et al. | 430/271 |
| 5,380,618 | 1/1995 | Kokubo et al. | 430/192 |
| 5,413,896 | 5/1995 | Kajita et al. | 430/192 |

FOREIGN PATENT DOCUMENTS

0365318A2  4/1990  European Pat. Off. .
0415266A2  3/1991  European Pat. Off. .

*Primary Examiner*—John S. Chu
*Attorney, Agent, or Firm*—Wenderoth, Lind & Ponack

[57] ABSTRACT

Disclosed is an improved positive-working photoresist composition comprising an alkali-soluble resin as a film-forming agent and a quinone diazide group-containing compound as a photosensitive agent. The most characteristic feature of the inventive composition consists in the unique formulation of the alkali-soluble resin which is a combination of two or three kinds of novolac resins selected from novolac resins (a), (b1) or (b2) and (c1) or (c2), each of which is characterized by the unique formulation of the phenolic compounds as a mixture to be subjected to a condensation reaction with an aldehyde compound to form the novolac resin. Namely, the phenolic mixture for the novolac (a) consists of m- and p-cresols, the phenolic mixture for the novolac (b1) consists of m-cresol and a xylenol, the phenolic mixture for the novolac (b2) consists of m- and p-cresols and a xylenol, the phenolic mixture for the novolac (c1) consists of m-cresol and a trimethyl phenol and the phenolic mixture for the novolac (c2) consists of m- and p-cresols and a trimethyl phenol each in a specified molar proportion of the constituent phenolic compounds.

44 Claims, No Drawings

HIGH-SENSITIVITY POSITIVE-WORKING PHOTORESIST COMPOSITION

BACKGROUND OF THE INVENTION

The present invention relates to a novel positive-working photoresist composition or, more particularly, to a high-sensitivity positive-working photoresist composition capable of giving a finely patterned resist layer in a high resolution and excellent in the cross sectional profile of the patterned layer and heat resistance with an excellent characteristic of focusing depth latitude.

As is known, the photolithographic patterning is a well established technology in the process for the manufacture of semiconductor devices such as ICs, LSIs and the like and liquid-crystal devices such as liquid crystal display panels and the like. The photolithographic patterning work is conducted by first forming a layer of a so-called photoresist composition which is pattern-wise exposed to light to form a latent image of the pattern followed by development. Of the two types of photoresist compositions including positive-working and negative-working ones, the positive-working photoresist compositions are preferred in most cases to the negative-working ones and the essential ingredients in a typical positive-working photoresist composition under practical use include an alkali-soluble resin as a film-forming ingredient and a quinone diazide group-containing compound as a photosensitive ingredient.

The alkali-soluble resin as a film-forming ingredient in a positive-working photoresist composition most widely used in practical applications is a novolac resin in respect of the advantageous properties thereof that the resin is soluble in an alkaline aqueous solution as a developer solution without swelling to exhibit excellent developability and the resist layer formed therefrom has excellent heat resistance to withstand plasma etching with the patterned resist layer as an etching mask.

The quinone diazide group-containing compound as the photosensitive ingredient is very unique because the compound in itself has an activity to suppress the alkali solubility of the novolac resin while, when irradiated pattern-wise with actinic rays including electromagnetic waves such as ultraviolet light, e.g., g-line and i-line, and far-ultraviolet light, e.g., excimer laser beams, and corpuscular rays for pattern-wise scanning such as electron beams, the quinone diazide group-containing compound per se is converted into an alkali-soluble form along with promotion of the alkali-solubility of the novolac resin. Thus, a great number of positive-working photoresist compositions comprising a quinone diazide group-containing compound and an alkali-soluble novolac resin and capable of exhibiting a great change in the properties by exposure to actinic rays such as electromagnetic waves and corpuscular rays have been developed and brought under practical applications (see, for example, U.S. Pat. No. 4,377,631, Japanese Patent Kokai No. 62-35349, Japanese Patent Kokai No. 1-142548, Japanese Patent Kokai No. 1-179147 and Japanese Patent Publication No. 3-4897).

Along with the increase year by year in the degree of integration in the semiconductor devices and liquid crystal devices in recent years, the accuracy required in the photolithographic patterning work is so high as to have a fineness in the order of submicrons, half microns or even finer in the manufacture of, for example, VLSIs. Accordingly, the positive-working photoresist composition used therefor must satisfy several requirements that the composition can give a patterned resist layer having high resolution of the patterned images, that the patterned resist layer has an excellently orthogonal cross sectional profile and excellent heat resistance not to cause thermal deformation in the dry etching or the post-exposure baking, i.e. heat treatment after exposure to actinic rays and before development, and that the sensitivity thereof is high in respect of the productivity along with an excellent focusing depth latitude so as to facilitate reproduction of the resist pattern with high fidelity to the mask pattern without being affected by a level difference on the substrate surface.

As a means to accomplish the above mentioned requirements in the performance of a positive-working photoresist composition, various attempts and proposals have been made for the improvement of the performance of the alkali-soluble resin as the film-forming ingredient therein. For example, Japanese Patent Kokai No. 2-867 proposes a positive-working photoresist composition in which the film-forming resin is a resin blend consisting of a first resin which is a condensation product of 2,5-xylenol, m-cresol and p-cresol with an aqueous formaldehyde solution and a second resin which is a condensation product of 3,5-xylenol, m-cresol and p-cresol with an aqueous formaldehyde solution. These resin blends are defective in the poor resolution and form of the contact holes as a consequence of the fact that each of the constituent resins is a xylenol-cresol novolac resin and they are also not satisfactory in respect of the resolution as the most important factor to influence on the working accuracy of ultra-fine patterning in recent years and in respect of the sensitivity to accomplish a high throughput of the products.

Further, Japanese Patent Kokai No. 2-108054 proposes a positive-working photoresist composition of which the film-forming ingredient is a resin blend consisting of a high molecular-weight novolac resin obtained by the condensation reaction of m-cresol, 2,3,5-trimethyl phenol and, optionally, p-cresol with an aldehyde compound having a weight-average molecular weight of 4000 to 20000 and a low molecular-weight novolac resin having a weight-average molecular weight of 200 to 2000. Japanese Patent Kokai No. 3-228059 also proposes a photoresist composition similar to that described above. Although these photoresist compositions have improved heat resistance and photosensitivity as a consequence of blending of two different novolac resins, one, having a relatively large weight-average molecular weight and, the other, having a small weight-average molecular weight, they are still insufficient in respect of the resolution as an essential requirement to obtain a high patterning accuracy in the ultrafine patterning works in recent years and photosensitivity to accomplish a high throughput of the products.

On the other hand, it would be a possible approach to improve the resolution in the photolithographic patterning by increasing the numerical aperture of the lens system in the light-exposure apparatus but a large numerical aperture of the lens system is incompatible with the requirement for a good focusing depth latitude so that such a means is hardly applicable when the surface of the resist layer has a relatively large level difference. It is eagerly desired therefore to develop a positive-working photoresist composition which is safe from the problem of a decrease in the focusing depth even with an increased numerical aperture of the lens system while none of the prior art positive-working photoresist compositions meets such a requirement.

SUMMARY OF THE INVENTION

The present invention accordingly has an object to provide a novel and improved positive-working photoresist composition capable of giving a patterned resist layer having excellent cross sectional profile of the line pattern and excellent heat resistance with high resolution in a high photosensitivity and excellent focusing depth latitude.

Thus, the positive-working photoresist composition of the present invention is a uniform mixture which comprises:

(A) an alkali-soluble resin as a film-forming ingredient; and (B) a quinone diazide group-containing compound as a photosensitizing ingredient, said alkali-soluble resin being a combination of at least two kinds of alkali-soluble novolac resins selected (I) from the group consisting of:

(a) a first novolac resin which is a condensation product of a mixture of phenolic compounds consisting of from 35 to 48% by moles of m-cresol and from 52 to 65% by moles of p-cresol with an aldehyde compound;

(b1) a second novolac resin which is a condensation product of a mixture of phenolic compounds consisting of from 50 to 70% by moles of m-cresol and from 30 to 50% by moles of a xylenol with an aldehyde compound; and (c1) a third novolac resin which is a condensation product of a mixture of phenolic compounds consisting of from 60 to 80% by moles of m-cresol and from 20 to 40% by moles of a trimethyl phenol with an aldehyde compound or (c2) a fourth novolac resin which is a condensation product of a mixture of phenolic compounds consisting of from 30 to 50% by moles of m-cresol, from 10 to 30% by moles of a trimethyl phenol and from 20 to 60% by moles of p-cresol with an aldehyde compound, in a specified weight proportion or (II) from the group consisting of:

(a) the above defined first novolac resin;

(b2) a fifth novolac resin which is a condensation product of a mixture of phenolic compounds consisting of from 35 to 50% by moles of m-cresol, from 25 to 35% by moles of a xylenol and from 15 to 40% by moles of p-cresol with an aldehyde compound; and (c1) the above defined third novolac resin or (c2) the above defined fourth novolac resin, in a specified weight proportion, said combination of at least two kinds of the alkali-soluble novolac resins as a whole having a weight-average molecular weight in the range from 3000 to 7000.

DETAILED DESCRIPTION OF THE PREFERRED EMBODIMENTS

As is described above, the most characteristic feature of the inventive positive-working photoresist composition of the invention consists in the unique formulation of the alkali-soluble resin as the film-forming ingredient, which is a combination of at least two kinds, i.e. two kinds or three kinds, of the alkali-soluble novolac resins selected from the group consisting of three kinds of novolac resins (a), (b1) and (c1) or (c2) or from the group consisting of three kinds of novolac resins (a), (b2) and (c1) or (c2).

The first novolac resin as the component (a) is a condensation product of a mixture of phenolic compounds consisting of m- and p-cresols with an aldehyde compound. The molar proportion of the m-cresol to p-cresol is in the range from 35:65 to 48:52 or, preferably, from 37:63 to 45:55.

The aldehyde compound to be subjected to the condensation reaction with the above mentioned phenolic compounds is not particularly limitative and can be selected from various kinds of aldehyde compounds including formaldehyde, paraformaldehyde, trioxane, acetaldehyde, propionaldehyde, butyraldehyde, trimethyl acetaldehyde, acrolein, crotonaldehyde, cyclohexane aldehyde, furrural, furyl acrolein, benzaldehyde, terephthalaidehyde, phenyl acetaldehyde, α- and β-phenyl propionaldehydes, o-, m- and p-hydroxy benzaladehydes, o-, m- and p-methyl benzaldehydes, o-, m- and p-chloro benzaladehydes, o-, m- and p-tolualdehydes, cinnamaldehyde and the like. These aldehyde compounds can be used either singly or as a combination of two kinds or more according to need although formaldehyde is preferred in respect of the availability and the cost and a combination of formaldehyde and a hydroxy benzaldehyde is preferred when an improvement is desired in the heat resistance of the patterned resist layer.

The synthetic procedure for the preparation of the novolac resin by the condensation reaction of the phenolic compounds and the aldehyde compound can be conventional by using an acid as the catalyst such as hydrochloric acid, sulfuric acid, formic acid, acetic acid, oxalic acid, p-toluene sulfonic acid and the like. It is important, however, that the novolac resin as the component (a) as prepared by the condensation reaction has a weight-average molecular weight in the range from 2100 to 3800 or, preferably, from 2400 to 3200. The weight-average molecular weight of the novolac resin here implied can be determined by making reference to polystyrenes.

When a novolac resin prepared from m- and p-cresols, of which the proportion of the m- and p-cresols as well as the weight-average molecular weight do not satisfy the above described requirements, is used in place of the component (a), the positive-working photoresist composition comprising the same would be inferior in the photosensitivity and resolution, in particular, at contact holes not to ensure fidelity of the reproduced pattern to the mask pattern.

The second novolac resin as the component (b1) is prepared by the condensation reaction of a mixture of phenolic compounds consisting of m-cresol and a xylenol with an aldehyde compound. The xylenol which can be used here includes 2,3-xylenol, 2,5-xylenol, 3,4-xylenol, 3,5-xylenol and the like, of which 3,5- and 2,5-xylenols are preferred. The molar proportion of m-cresol and the xylenol in the combination thereof is in the range from 50:50 to 70:30 or, preferably, from 55:45 to 65:35. The synthetic procedure for the preparation of this second novolac resin as the component (b1) can be conventional as in the preparation of the first novolac resin as the component (a). It is also important that the novolac resin as the component (b1) as prepared by the condensation reaction has a weight-average molecular weight in the range from 2100 to 3800 or, preferably, from 2500 to 3500. When the molar proportion of m-cresol and the xylenol and/or the weight-average molecular weight of the resin as prepared do not satisfy the above described requirements, a decrease is caused in the photosensitivity and resolution of the photoresist composition along with eventual occurrence of microscopic defects in the patterned resist layer.

Formulation of the positive-working photoresist composition of the invention with the second novolac resin as the component (b1) is advantageous in respect of obtaining excellent pattern formability because the component (b1) has an effect to prevent occurrence of microscopic defects in the patterned resist layer due to bubble formation in the resist layer by exposure to light as is sometimes the case in high-resolution photoresist compositions developed in recent years. The above mentioned bubble formation in the resist layer by exposure to light is presumably due to evolution of nitrogen gas in the form of tiny bubbles from the quinone diazide group-containing compound by a photochemical reaction.

The third novolac resin as the component (c1) in the combination of the alkali-soluble novolac resins is obtained by the condensation reaction of a mixture of phenolic compounds consisting of m-cresol and a trimethyl phenol with an aldehyde compound. The trimethyl phenol which can be used here includes 2,3,5-trimethyl phenol, 3,4,5-trimethyl phenol and the like, of which 2,3,5-trimethyl phenol is preferred. The molar proportion of m-cresol and the trimethyl phenol in the combination thereof is in the range from 60:40 to 80:20 or, preferably, from 65:35 to 75:25. The synthetic procedure for the preparation of this third novolac resin as the component (c1) can be conventional as in the preparation of the first novolac resin as the component (a). It is also important that the novolac resin as the component (c1) as prepared by the condensation reaction has a weight-average molecular weight in the range from 2100 to 3800 or, preferably, from 2100 to 2600. When the molar proportion of m-cresol and the trimethyl phenol and/or the weight-average molecular weight of the resin as prepared do not satisfy the above described requirements, a decrease is caused in the photosensitivity and resolution of the photoresist composition.

This third novolac resin as the component (c1) in the photoresist composition has an effect of improving the developability of the resist layer with an aqueous alkaline developer solution after pattern-wise exposure to light because of enhancement of the solubility of the resist layer in the exposed area and suppression of the solubility in the unexposed areas with consequent improvement in the photosensitivity and resolution of the resist layer.

The alkali-soluble resinous constituent in the inventive positive-working photoresist composition is a combination of two or three kinds of the three novolac resins as the components (a), (b1) and (c1). Namely, possible combinations include the compositions of (a) and (b1), compositions of (a) and (c1), compositions of (b1) and (c1) and compositions of (a), (b1) and (c1).

Alternatively, the above mentioned third novolac resin as the component (c1) can be replaced with a fourth novolac resin as the component (c2) which is prepared by the condensation reaction of a mixture of three phenolic compounds consisting of m-cresol, a trimethyl phenol and p-cresol. The molar contents of m-cresol, trimethyl phenol and p-cresol in the combination thereof are in the ranges from 30 to 50%, from 10 to 30% and from 60 to 20%, respectively, or, preferably, in the ranges from 32 to 45%, from 15 to 28% and from 53 to 27%, respectively. The synthetic procedure for the preparation of this fourth novolac resin as the component (c2) can be conventional as in the preparation of the first novolac resin as the component (a). It is also important that the novolac resin as the component (c2) as prepared by the condensation reaction has a weight-average molecular weight in the range from 2100 to 3800 or, preferably, from 2100 to 2600. When the molar proportion of three phenolic compounds and/or the weight-average molecular weight of the resin as prepared do not satisfy the above described requirements, a decrease is caused in the photosensitivity and resolution of the photoresist composition.

This fourth novolac resin as the component (c2) in the photoresist composition also has an effect of improving the developability of the resist layer with an aqueous alkaline developer solution after pattern-wise exposure to light because of enhancement of the solubility of the resist layer in the exposed areas and suppression of the solubility in the unexposed areas with consequent improvement in the photosensitivity and resolution of the resist layer.

It is further alternative to replace the second novolac resin as the component (b1) with a fifth novolac resin as the component (b2) which is prepared by the condensation reaction of a mixture of three phenolic compounds consisting of m-cresol, a xylenol and p-cresol with an aldehyde compound. The molar contents of m-cresol, a xylenol and p-cresol in the combination thereof are in the ranges from 35 to 50%, from 25 to 35% and from 40 to 15%, respectively, or, preferably, in the ranges from 37 to 45%, from 27 to 35% and from 36 to 20%, respectively. The synthetic procedure for the preparation of this fifth novolac resin as the component (b2) can be conventional as in the preparation of the first novolac resin as the component (a). It is also important that the novolac resin as the component (b2) as prepared by the condensation reaction has a weight-average molecular weight in the range from 2100 to 3800 or, preferably, from 2500 to 3500. When the molar proportion of m-cresol, a xylenol and p-cresol and/or the weight-average molecular weight of the resin as prepared do not satisfy the above described requirements, a decrease is caused in the photosensitivity and resolution of the photoresist composition along with eventual occurrence of microscopic defects in the patterned resist layer.

Formulation of the positive-working photoresist composition of the invention with the fifth novolac resin as the component (b2) is advantageous in respect of obtaining excellent pattern formability because the component (b2) has an effect to prevent occurrence of microscopic defects in the patterned resist layer due to the bubble formation in the resist layer by exposure to light as is sometimes the case in high-resolution photoresist compositions developed in recent years.

The positive-working photoresist composition of the present invention can be prepared by uniformly dissolving, in an organic solvent, a quinone diazide group-containing compound as the component (B) and a combination of two or three kinds of the above described novolac resins as the component (a), component (b1) or (b2) and component (c1) or (c2) as the component (A). The use of two or three kinds of different novolac resins in combination is effective in imparting the photoresist composition with improved sensitivity and focusing depth latitude and the patterned resist layer formed therefrom with improved resolution and cross sectional profile of a line pattern.

The blending proportion of the respective novolac resins in the combination thereof has some influences on the performance of the photoresist composition. When the film-forming ingredient as the component (A) in the inventive composition is a binary combination of the component (a) and component (b1) or (b2), the weight proportion of (a):(b1) or (a):(b2) is in the range from 40:60 to 70:30 or, preferably, in the range from 45:55 to 65:35. When the film-forming ingredient in the inventive composition is a binary combination of the component (a) and component (c1) or (c2), the weight proportion of (a):(c1) or (a):(c2) is in the range from 20:80 to 60:40 or, preferably, in the range from 25:75 to 55:45. When the film-forming ingredient in the inventive composition is a binary combination of the component (b1) or (b2) and component (c1) or (c2), the weight proportion of (b1):(c1), (b1):(c2), (b2):(c1) or (b2):(c2) is in the range from 20:80 to 50:50 or, preferably, in the range from 25:75 to 50:50. When the film-forming ingredient in the inventive composition is a ternary combination of the components (a), (b1) or (b2) and (c1) or (c2), the amounts of the components (a), (b1) or (b2) and (c1) or (c2) in the composition are, assuming that the total amount of the three components is 100 parts by weight, in the ranges from 20 to 70 parts by weight of (a), from 10 to 30 parts by weight of (b1) or (b2) and from 20 to 50 parts by weight of (c1) or (c2) or, preferably, in the ranges from 25 to 65 parts by weight of (a), from 15 to 25 parts by weight of (b1) or (b2) and from 25 to 45 parts by weight of (c1) or (c2).

When the combination of the novolac resins includes the component (b1) or (b2) which is prepared from a mixture of the phenolic compounds including a xylenol, it is preferable that the molar fraction of the xylenol in the overall phenolic compounds used for the preparation of the two or three kinds of the novolac resins is in the range from 3 to 20% in respect of the photosensitivity, resolution and cross sectional profile of the line patterns. Similarly, when the combination of the novolac resins includes the component (c1) or (c2) which is prepared from a mixture of the phenolic compounds including a trimethyl phenol, it is preferable that the molar fraction of the trimethyl phenol in the overall phenolic compounds used for the preparation of the two or three kinds of the novolac resins is in the range from 3 to 16% in respect of the photosensitivity, resolution and cross sectional profile of the line patterns. Further, when the combination of the novolac resins includes both of the component (b1) or (b2) and component (c1) or (c2), it is preferable that the molar fraction of the xylenol in the overall phenolic compounds used for the preparation of the two or three kinds of the novolac resins is in the range from 2 to 16% and the molar fraction of the trimethyl phenol in the overall phenolic compounds used for the preparation of the two or three kinds of the novolac resins is in the range from 2 to 13% in respect of the photosensitivity, resolution and cross sectional profile of the line patterns.

It is further preferable that the mixture of two or three kinds of the novolac resins has a weight-average molecular weight in the range from 3000 to 7000 or, preferably, in the range from 3800 to 6000 by making reference to polystyrenes. When this value is too low, the patterned resist layer would have poor heat resistance while, the value is too high, a decrease is caused in the photosensitivity of the photoresist composition. When the novolac resins each as prepared by the condensation reaction are blended together and the weight-average molecular weight of the mixture is lower than the above mentioned lower limit, the novolac resin mixture is subjected to the removal of low molecular-weight fractions so as to bring the weight-average molecular weight of the remaining portion into the above mentioned preferable range. This fractionation treatment can be performed by dissolving the novolac resin mixture in an organic solvent having good dissolving power to the resin mixture and pouring the solution into a large volume of another solvent having no or poor dissolving power to the resin such as water, heptane, hexane, pentane, cyclohexane and the like. It is of course optional that the fractionation treatment is performed for each of the novolac resins before blending of the resins. The above mentioned good solvent for the novolac resin is exemplified by alcohols such as methyl alcohol and ethyl alcohol, ketones such as acetone and methyl ethyl ketone, glycol ether esters such as ethyleneglycol monoethyl ether acetate, cyclic ethers such as tetrahydrofuran and so on. It is of course that the fractionation treatment for the removal of low molecular weight fractions can be performed for each of the novolac resins as prepared before blending with one or two of the other novolac resins.

It is preferable that, even when the novolac resins as prepared each have a weight-average molecular weight higher than 3000, the fractionation treatment is undertaken for the resin to remove the low molecular weight fractions which may have some adverse influences on the performance of the photoresist composition.

The other essential ingredient in the inventive positive-working photoresist composition is a quinone diazide group-containing compound as the component (B), which is exemplified by partial or complete esterification products of a quinone diazide group-containing organic sulfonic acid or a functional derivative thereof, e.g., sulfonyl chloride, preferably, with an aromatic hydroxy compound and partial or complete amidation products of a quinone diazide group-containing compound mentioned above with an amino compound. The above mentioned quinone diazide group-containing sulfonic acid includes benzoquinonediazide sulfonic acid, naphthoquinonediazide sulfonic acid, anthraquinonediazide sulfonic acid and the like. In particular, naphthoquinone-1,2-diazide sulfonic acids such as naphthoquinone-1,2-diazide-5-sulfonic acid, naphthoquinone-1,2-diazide-4-sulfonic acid and naphthoquinone1,2-diazide-6-sulfonic acid, o-benzoquinonediazide sulfonic acid and o-anthraquinonediazide sulfonic acid are preferred.

The above mentioned aromatic hydroxy compound is exemplified by those belonging to the following four groups i) to iv).

i) Polyhydroxy benzophenone compounds including 2,3,4-trihydroxy benzophenone, 2,4,4'-trihydroxy benzophenone, 2,4,6-trihydroxy benzophenone, 2,3,4,4'-tetrahydroxy benzophenone, 2,2',4,4'-tetrahydroxy benzophenone, 2,3',4,4',6-pentahydroxy benzophenone, 2,2',3,4,4'-pentahydroxy benzophenone, 2,2',3,4,5'-pentahydroxy benzophenone, 2,3',4,5,5'-pentahydroxy benzophenone, 2,3,3',4,4',5'-hexahydroxy benzophenone and the like.

ii) Polyhydroxy aryl compounds represented by the general formula

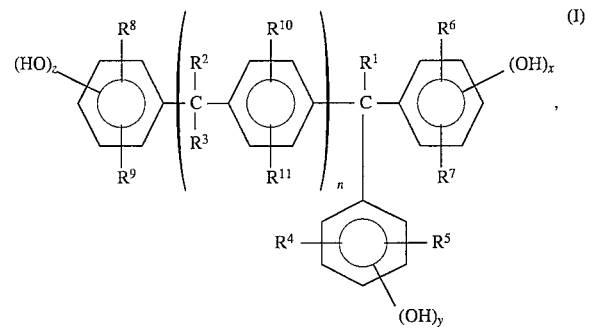

in which $R^1$ to $R^3$ are each a hydrogen atom or a lower alkyl group having, for example, 1 to 4 carbon atoms, $R^4$ to $R^9$ are each a hydrogen atom, halogen atom, lower alkyl group, lower alkoxy group, lower alkenyl group or cycloalkyl group, $R^{10}$ and $R^{11}$ are each a hydrogen atom, halogen atom or lower alkyl group, the subscripts x, y and z are each an integer of 1, 2 or 3 and the subscript n is 0 or 1, such as tris(4-hydroxypheynyl) methane bis(4-hydroxy-3,5-dimethylphenyl)-4-hydroxyphenyl) methane, bis(4-hydroxy-3,5-dimethylphenyl)-3-hydroxyphenyl methane, bis(4-hydroxy-3,5-dimethylphenyl)-2-hydroxyphenyl methane, bis(4-hydroxy-2,5-dimethylphenyl)-4-hydroxyphenyl methane, bis(4-hydroxy-2,5-dimethylphenyl)-3-hydroxyphenyl methane, bis(4-hydroxy-2,5-dimethylphenyl)-2-hydroxyphenyl methane, bis(4-hydroxy-3,5-dimethylphenyl)-3,4-dihydroxyphenyl methane, bis(4-hydroxy-2,5- dimethylphenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(4-hydroxyphenyl)-3-methoxy-4-hydroxyphenyl methane, bis(3-cyclohexyl-4-hydroxy phenyl)-3-hydroxyphenyl methane, bis(3-cyclohexyl-4-hydroxy phenyl)-2-hydroxyphenyl methane, bis(3-cyclohexyl-4-hydroxy phenyl)-4-hydroxyphenyl methane, bis(3-cyclohexyl-4-hydroxy-6-methylphenyl)-2-hydroxyphenyl methane, bis(3-cyclohexyl-4-hydroxy-6-methylphenyl)-3-hydroxyphenyl methane, bis(3-cyclohexyl-4-hydroxy-6-methylphenyl)-4-hydroxyphenyl methane, bis(3-cyclohexyl-4-hydroxy-6-methylphenyl)-3,4-dihydroxyphenyl methane, bis(3-cyclohexyl-6-hydroxy phenyl)-3-hydroxyphenyl methane, bis(3-cyclohexyl-6 -hydroxy phenyl)-4-hydroxyphenyl methane, bis(3-cyclohexyl-6 -hydroxy phenyl)-2-hydroxyphenyl methane, bis(3-cyclohexyl-6-hydroxy-4-methylphenyl)-2-hydroxyphenyl methane, bis(3-cyclohexyl-6-hydroxy-4-methylphenyl)-4-hydroxyphenyl methane, bis(3-cyclohexyl-6-hydroxy-4-methylphenyl)-3,4-dihydroxyphenyl methane, 1-[1-(4-hydroxyphenyl)isopropyl]-4-[1,1-bis(4-hydroxyphenyl)ethyl] benzene, 1-[1-(3-methyl-4-hydroxyphenyl)isopropyl]-4-[1,1-bis(3-methyl-4-hydroxyphenyl)ethyl] benzene and the like.

iii) Polyhydroxy diphenylalkane compounds represented by the general formula

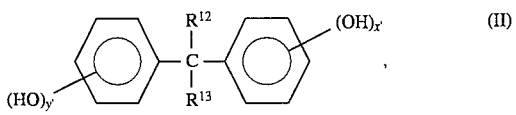

in which $R^{12}$ and $R^{13}$ are each a hydrogen atom or lower alkyl group and the subscripts x' and y' are each an integer of 1, 2 or 3, such as 2-(2,3,4-trihydroxyphenyl)-2-(2',3',4'-trihydroxyphenyl) propane, 2-(2,4-dihydroxyphenyl)-2-(2', 4'-dihydroxyphenyl) propane, 2-(4-hydroxyphenyl)-2-(4'-hydroxyphenyl) propane, bis(2,3,4-trihydroxyphenyl) methane, bis(2,4-dihydroxyphenyl) methane and the like.

iv) Other hydroxy aromatic compounds such as phenol, p-methoxy phenol, dimethyl phenols, hydroquinone, bisphenol A, naphthol, pyrocatechol, pyrogallol monomethyl ether, pyrogallol-1,3-dimethyl ether, gallic acid and partial esterification or etherification products of gallic acid.

The quinone diazide group-containing compound as the photosensitive ingredient in the photoresist composition of the invention can be prepared, for example, by the partial or complete esterification reaction of a naphthoquinone-1,2-diazide-4- or -5-sulfonyl halide with an aromatic hydroxy compound belonging to either one of the above described classes i) to iv). This condensation reaction can be performed, preferably, in a suitable organic solvent such as dioxane, N-methyl pyrrolidone, N,N-dimethyl acetamide and the like in the presence of an alkaline condensation agent such as triethanolamine, alkali carbonates, alkali hydrogencarbonates and the like. The thus obtained esterification product should have a degree of esterification of at least 50% or, preferably, at least 60% in order to obtain a high resolution of patterning with the photoresist composition. Accordingly, the esterification reaction is conducted by using the naphthoquinone-1,2-diazide-4- or -5-sulfonyl halide in an amount of at least 0.5 mole or, preferably, at least 0.6 mole per mole of the hydroxy groups in the aromatic hydroxy compound.

It is optional that the positive-working photoresist composition of the present invention is admixed with a limited amount of an additional aromatic polyhydroxy compound selected from the polyhydroxy compounds represented by the general formula (I) and the aromatic polyhydroxy compounds represented by the following general formula

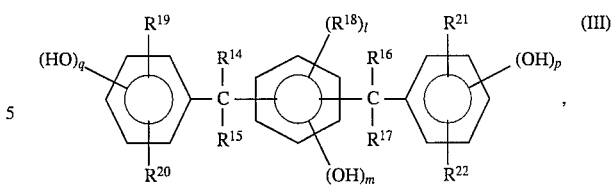

in which $R^{14}$ to $R^{17}$ are each a hydrogen atom or a lower alkyl group, $R^{18}$ to $R^{22}$ are each a hydrogen atom, halogen atom, lower alkyl group or lower alkoxy group and the subscripts l, m, p and q are each 1, 2 or 3 with the proviso that l+m is 4. The amount of these additional aromatic polyhydroxy compounds in the inventive photoresist composition is, when added, in the range from 5 to 50% by weight or, preferably, from 10 to 35% by weight based on the amount of the alkali-soluble resinous ingredient as the component (A).

Examples of particularly suitable additional polyhydroxy aromatic compounds represented by the general formula (I) include: bis(4-hydroxy-3,5-dimethylphenyl)-2-hydroxyphenyl methane, bis(4-hydroxy-2,5-dimethylphenyl)-2-hydroxyphenyl methane, bis(4-hydroxy-2,6-dimethylphenyl)-2-hydroxyphenyl methane, bis(4-hydroxy-3,5-dimethylphenyl)-3,4-dihydroxyphenyl methane, 1-[1-(4-hydroxyphenyl)isopropyl]-4-[1,1-bis(4-hydroxyphenyl) ethyl] benzene, 1-[1-(3-methyl-4-hydroxyphenyl)isopropyl] -4-[1,1-bis(3-methyl-4-hydroxyphenyl)ethyl] benzene and the like; and examples of the compounds represented by the general formula (III) include: 2,6-bis[1-(2,4-dihydroxyphenyl)isopropyl]-4-methyl phenol, 4,6-bis[1-(4-hydroxyphenyl)isopropyl] resorcin, 4,6-bis(3,5-dimethoxy-4-hydroxyphenylmethyl) pyrogallol, 4,6-bis(3,5-dimethyl-4-hydroxyphenylmethyl) pyrogallol, 2,6-bis(3-methyl-4,6-dihydroxyphenylmethyl)-4-methyl phenol, 2,6-bis(2,3,4-trihydroxyphenylmethyl)-4-methyl phenol and the like.

The amount of the photosensitive ingredient as the component (B) in the inventive photoresist composition is in the range from 5 to 100% by weight or, preferably, from 10 to 50% by weight based on the amount of the alkali-soluble resinous ingredient as the component (A) or based on the total amount of the component (A) and the above described optional additional polyhydroxy aromatic compound, when used. When the amount of the component (B) is too small, a decrease is caused in the pattern reproducibility not to give a reproduced pattern having high fidelity to the mask pattern while, when the amount thereof is too large, the uniformity of the resist layer is decreased to cause a decrease in the resolution of the pattern.

It is of course optional that the photoresist composition of the invention is admixed each with a limited amount of various kinds of additives having compatibility with the essential ingredients including auxiliary resinous ingredients, plasticizers and stabilizers to improve the film characteristics of the resist layer and coloring agents to improve the visibility of the patterned resist layer obtained by the development treatment. It is of course that the photoresist composition of the invention is used in the form of a solution prepared by dissolving the essential and optional ingredients in an organic solvent.

Examples of suitable organic solvents include ketones such as acetone, methyl ethyl ketone, cyclohexanone and methyl isoamyl ketone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as ethers thereof, e.g., monomethyl ethers, monoethyl ethers, monopropyl ethers, monobutyl ethers and monophenyl ethers, cyclic ethers such as dioxane, and esters such as ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more according to need.

Following is a typical procedure for the photolithographic patterning work by using the positive-working photoresist composition of the present invention. Namely, the surface of a substrate such as a semiconductor silicon wafer is uniformly coated with the photoresist composition in the form of a solution as prepared in the above described manner by using a suitable coating machine such as spin coaters to form a resist layer which is exposed pattern-wise through a patterned photomask to ultraviolet light emitted from a suitable light source such as low-, high- and ultrahigh-pressure mercury lamps, arc lamps, xenon lamps and the like or irradiated with electron beams under pattern-wise scanning to form a latent image of the pattern with high photosensitivity followed by development thereof with a weakly alkaline aqueous solution, such as a 1 to 10% by weight aqueous solution of tetramethyl ammonium hydroxide, as a developer so that the resist layer in the areas exposed to the actinic rays is dissolved away leaving a patterned resist layer with high fidelity to the mask pattern. The thus obtained patterned resist layer is advantageous in respect of the high resolution to ensure ultra-fine patterning, high heat resistance and ideally orthogonal cross sectional profile of the line pattern. In particular, the latitude for the focusing depth with the inventive photoresist composition is so large that quite satisfactory patterning can be accomplished even on a substrate surface having level differences or having protrusions and recesses or having a high reflectivity to the actinic rays to be useful in the manufacture of ICs and VLSIs.

In the following, the positive-working photoresist composition of the present invention is described in more detail by way of examples which, however, never limit the scope of the invention in any way. In the following examples, the photoresist compositions prepared therein were evaluated for the following items in a procedure respectively described there. The term of "parts" in the following always refers to "parts by weight".

(1) Photosensitivity

A semiconductor silicon wafer was uniformly coated with the photoresist composition on a spinner followed by drying at 90° C. for 90 seconds to form a resist layer having a film thickness of 1.05 μm. The resist layer was pattern-wise exposed to ultraviolet light through a test pattern mask on a minifying projection exposure machine (Model NSR-1755i7B, manufactured by Nikon Co., NA=0.54) for a length of time increased stepwise from 100 mseconds with a 10 mseconds increment up to several hundreds mseconds followed by a post-exposure baking treatment at 110° C. for 90 seconds and a development treatment in a 2.38% by weight aqueous solution of tetramethyl ammonium hydroxide with subsequent rinse in running water for 35 seconds. The minimum exposure time in mseconds, which was sufficient for the complete removal of the resist layer in the exposed areas by the development treatment, was recorded as a measure of the photosensitivity of the photoresist composition.

(2) Resolution

A test patterning work was conducted in the same manner as in the measurement of the photosensitivity described above but at an exposure dose, by which a line-and-space pattern of 0.70 μm width could be reproduced to give a pattern with a line:space width ratio of 1:1, and the minimum width of the line-and-space pattern which could be resolved in the reproduced pattern was recorded as the critical resolution at the exposure dose for the reproduction of the mask pattern.

(3) Heat resistance

A silicon semiconductor wafer, on which a patterned resist layer with a line pattern of 5 μm width was formed, was subjected to a baking treatment for 5 minutes on a hot plate at 125° C., 130° C., 135° C. or 140° C. and records were made for the lowest temperature at which deformation in the patterned resist layer could be detected.

(4) Cross sectional profile of line pattern

A cross section of a silicon semiconductor wafer, on which a patterned resist layer with a line pattern of 0.70 μm width was formed, was examined on a scanning electron microscopic photograph for the cross sectional profile of the line pattern and the results were recorded by the ratings of A, B and C for an orthogonal profile, trapezoidal profile with slightly rounded shoulders and isosceles triangular profile with a round apex, respectively.

(5) Focusing depth latitude (a) Test exposure was conducted at the exposure dose Eop required for the reproduction of a line-and-space pattern of 0.50 μm width in a 1:1 line:space width ratio on a minilying projection exposure machine (Model NSR-1755i7B, manufactured by Nikon Co., NA=0.54) by slightly displacing the focus point up and down and the cross sectional profiles of the line patterns of 0.50 μm width obtained by the development treatment were examined on a scanning electron microscopic photograph. Recording was made for the largest displacement of the focus point in μm by which a line pattern of 0.50 μm width with an orthogonal cross section could be obtained.

(b) Test exposure was conducted at the exposure dose Eop required for the reproduction of a line-and-space pattern of 0.70 μm width in a 1:1 line:space width ratio on the same exposure machine as above by slightly displacing the focus point up and down and the cross sectional profiles of the line patterns of 0.70 μm width obtained by the development treatment were examined on a scanning electron microscopic photograph. Recording was made for the largest displacement of the focus point in μm by which a line pattern of 0.70 μm width with an orthogonal cross section could be obtained.

Preparation Example 1

Into a flask of 1 liter capacity were introduced 279 g of a 43:57 by moles mixture of m- and p-cresols (2.58 moles as a total) and 10 g of a 10% by weight aqueous solution of oxalic acid to form a mixture which was heated and kept at 100° C. Thereafter, 202.7 g of a 37% formalin were added thereto under agitation dropwise over a period of 30 minutes and agitation of the mixture was continued for additional 30 minutes followed by removal of water as the condensation product by further increasing the temperature and removal of the unreacted m- and p-cresols under a reduced pressure of 10 mmHg to give a novolac resin, referred to as the Resin A hereinafter, having a weight-average molecular weight of 2800 as determined by the method of gel permeation chromatography making reference to mono-disperse polystyrenes as the standard.

Preparation Example 2

The procedure for the preparation of a second novolac resin, referred to as the Resin B1 hereinafter, was about the same as in the preparation of the Resin A described above except that the mixture of the phenolic compounds, of which the total amount was 2.58 moles, consisted of m-cresol and 3,5-xylenol in a molar ratio of 60:40. The resin B1 had a weight-average molecular weight of 2700.

Preparation Example 3

The procedure for the preparation of a third novolac resin, referred to as the Resin B2 hereinafter, was about the same as in the preparation of the Resin A described above except that the mixture of the phenolic compounds, of which the total amount was 2.58 moles, consisted of m-cresol, p-cresol and 3,5-xylenol in a molar ratio of 43:25:32. The resin B2 had a weight-average molecular weight of 3000.

Preparation Example 4

The procedure for the preparation of a fourth novolac resin, referred to as the Resin C1 hereinafter, was about the same as in the preparation of the Resin A described above except that the mixture of the phenolic compounds, of which the total amount was 2.58 moles, consisted of m-cresol and 2,3,5-trimethyl phenol in a molar ratio of 70:30. The resin C1 had a weight-average molecular weight of 2300.

Preparation Example 5

The procedure for the preparation of a fifth novolac resin, referred to as the Resin C2 hereinafter, was about the same as in the preparation of the Resin A described above except that the mixture of the phenolic compounds, of which the total amount was 2.58 moles, consisted of m-cresol, p-cresol and 2,3,5-trimethyl phenol in a molar ratio of 35:40:25. The resin C2 had a weight-average molecular weight of 2400.

Comparative Preparation Example 1.

The procedure for the preparation of a sixth novolac resin, referred to as the Resin D hereinafter, was about the same as in the preparation of the Resin A described above except that the mixture of the phenolic compounds, of which the total amount was 2.58 moles, consisted of m-cresol and p-cresol in a molar ratio of 40:60. The resin D had a weight-average molecular weight of 1200.

Comparative Preparation Example 2

The procedure for the preparation of a seventh novolac resin, referred to as the Resin E hereinafter, was about the same as in the preparation of the Resin A described above except that the mixture of the phenolic compounds, of which the total amount was 2.58 moles, consisted of m-cresol and 3,5-xylenol in a molar ratio of 65:35. The resin E had a weight-average molecular weight of 6300.

Comparative Preparation Example 3

The procedure for the preparation of an eighth novolac resin, referred to as the Resin F hereinafter, was about the same as in the preparation of the Resin A described above except that the mixture of the phenolic compounds, of which the total amount was 2.58 moles, consisted of m-cresol and 2,3,5-trimethyl phenol in a molar ratio of 65:35. The resin F had a weight-average molecular weight of 7500.

Comparative Preparation Example 4

The procedure for the preparation of a ninth novolac resin, referred to as the Resin G hereinafter, was about the same as in the preparation of the Resin A described above except that the mixture of the phenolic compounds, of which the total amount was 2.58 moles, consisted of m-cresol, p-cresol and 3,5-xylenol in a molar ratio of 60:20:20. The resin G had a weight-average molecular weight of 8500.

Comparative Preparation Example 5

The procedure for the preparation of a tenth novolac resin, referred to as the Resin H hereinafter, was about the same as in the preparation of the Resin A described above except that the mixture of the phenolic compounds, of which the total amount was 2.58 moles, consisted of m-cresol, p-cresol and 2,5-xylenol in a molar ratio of 60:20:20. The resin G had a weight-average molecular weight of 9300.

Comparative Preparation Example 6.

The procedure for the preparation of an eleventh novolac resin, referred to as the Resin I hereinafter, was about the same as in the preparation of the Resin A described above except that the mixture of the phenolic compounds, of which the total amount was 2.58 moles, consisted of m-cresol, p-cresol and 2,3,5-trimethyl phenol in a molar ratio of 60:20:20. The resin G had a weight-average molecular weight of 9300.

EXAMPLE 1

The Resins A and B1 in a weight ratio of 1:1 were dissolved in methyl alcohol in a concentration of 15% by weight and a 100 g portion of this solution was poured into 40 g of water so as to precipitate the resin which was dehydrated and dried to give a resin blend having a weight-average molecular weight of 5100. The molar fraction of the 3,5-xylenol in the whole phenolic compounds used for the preparation of the Resins A and B1 was 20%.

A photoresist composition was prepared by dissolving, in a solvent mixture of 360 parts of ethyl lactate and 40 parts of butyl acetate, 100 parts of the above prepared resin blend, 30 parts of an esterification product of 1 mole of bis(3-cyclohexyl-4-hydroxy-6-methylphenyl)-3,4-dihydroxyphenyl methane and 2 moles of naphthoquinone-1,2-diazide-5-sulfonyl chloride, referred to as PAC1 hereinafter, and 20 parts of bis(4-hydroxy-3,5-dimethylphenyl)-2-hydroxyphenyl methane, referred to as PHC1 hereinafter, followed by filtration through a membrane filter of 0.2 μm pore diameter.

The results of the evaluation tests for the thus prepared photoresist composition are shown in Table 1 below.

EXAMPLE 2

The procedures for the preparation of the photoresist composition and evaluation tests thereof were substantially the same as in Example 1 except that the resin blend was prepared from the Resins A and B2 in a weight ratio of 1:1 instead of A and B1. The resin blend had a weight-average molecular weight of 5300 and the molar fraction of the 3,5-xylenol in the whole phenolic compounds used for the preparation of the Resins A and B2 was 16%.

The results of the evaluation tests for the thus prepared photoresist composition are shown in Table 1 below.

EXAMPLE 3

The procedures for the preparation of the photoresist composition and evaluation tests thereof were substantially the same as in Example 1 except that the resin blend was prepared from the Resins A and C1 in a weight ratio of 1:1 instead of A and B1 and replacement of PHC1 with the same amount of 1-[1-(4-hydroxyphenyl)isopropyl]-4-[1,1-bis(4hydroxyphenyl)ethyl] benzene, referred to as PHC2 hereinafter. The resin blend had a weight-average molecular weight of 4400 and the molar fraction of the 2,3,5-trimethyl phenol in the whole phenolic compounds used for the preparation of the Resins A and C1 was 15%.

The results of the evaluation tests for the thus prepared photoresist composition are shown in Table 1 below.

EXAMPLE 4

The procedures for the preparation of the photoresist composition and evaluation tests thereof were substantially the same as in Example 1 except that the resin blend was prepared from the Resins A and C2 in a weight ratio of 1:1 instead of A and B1, replacement of PAC1 with the same amount of an esterification product of 1 mole of 1-[1-(4-hydroxyphenyl)isopropyl]-4-[1,1-bis(4-hydroxyphenyl)ethyl] benzene and 2 moles of naphthoquinone-1,2-diazide-5-sulfonyl chloride, referred to as PAC2 hereinafter, and replacement of PHC1 with the same amount of PHC2. The resin blend had a weight-average molecular weight of 4800 and the molar fraction of the 2,3,5-trimethyl phenol in the whole phenolic compounds used for the preparation of the Resins A and C2 was 12%.

The results of the evaluation tests for the thus prepared photoresist composition are shown in Table 1 below.

EXAMPLE 5

The procedures for the preparation of the photoresist composition and evaluation tests thereof were substantially the same as in Example 1 except that the resin blend was prepared from the Resins B2 and C2 in a weight ratio of 1:1 instead of A and B1 and replacement of PAC1 and PHC1 each with the same amount of PAC2 and PHC2, respectively. The resin blend had a weight-average molecular weight of 3800 and the molar fractions of the 3,5-xylenol and 2,3,5-trimethyl phenol in the whole phenolic compounds used for the preparation of the Resins B2 and C2 were 16% and 12%, respectively.

The results of the evaluation tests for the thus prepared photoresist composition are shown in Table 1 below.

EXAMPLE 6

The procedures for the preparation of the photoresist composition and evaluation tests thereof were substantially the same as in Example 1 except that the resin blend was prepared from the Resins A, B1 and C1 in a weight ratio of 2:1:2 instead of A and B1, replacement of PAC1 with the same amount of PAC2 and replacement of PHC1 each with the same amount of 1,3-dihydroxy-4,6-bis[α-methyl-α-(4'-hydroxyphenyl)ethyl] benzene, referred to as PHC3 hereinafter. The resin blend had a weight-average molecular weight of 4500 and the molar fractions of the 3,5-xylenol and 2,3,5-trimethyl phenol in the whole phenolic compounds used for the preparation of the Resins A, B1 and C1 were 8% and 12%, respectively.

The results of the evaluation tests for the thus prepared photoresist composition are shown in Table 1 below.

EXAMPLE 7

The procedures for the preparation of the photoresist composition and evaluation tests thereof were substantially the same as in Example 1 except that the resin blend was prepared from the Resins A, B1 and C2 in a weight ratio of 2:1:2 instead of A and B1, replacement of 30 parts of PAC1 with 25 parts of an esterification product of 1 mole of 1-[1-(4-hydroxyphenyl)isopropyl]-4-[1,1-bis(4-hydroxyphenyl)ethyl] benzene and 3 moles of naphtoquinone-1,2-diazide-5-sulfonyl chloride, refered to as PAC3 hereinafter, and replacement of PHC1 with the same amount of PHC3. The resin blend had a weight-average molecular weight of 4700 and the molar fractions of the 3,5-xylenol and 2,3,5-trimethyl phenol in the whole phenolic compounds used for the preparation of the Resins A, B1 and C2 were 8% and 10%, respectively.

The results of the evaluation tests for the thus prepared photoresist composition are shown in Table 1 below.

EXAMPLE 8

The procedures for the preparation of the photoresist composition and evaluation tests thereof were substantially the same as in Example 1 except that the resin blend was prepared from the Resins A, B2 and C2 in a weight ratio of 2:1:2 instead of A and B1, replacement of 30 parts of PAC1 with 25 parts of PAC3 and replacement of PHC1 with the same amount of PHC3. The resin blend had a weight-average molecular weight of 4700 and the molar fractions of the 3,5-xylenol and 2,3,5-trimethyl phenol in the whole phenolic compounds used for the preparation of the Resins A, B2 and C2 were 7% and 10%, respectively.

The results of the evaluation tests for the thus prepared photoresist composition are shown in Table 1 below.

Comparative Example 1

The procedures for the preparation of the photoresist composition and evaluation tests thereof were substantially the same as in Example 1 except that the resin blend was prepared from the Resins D and E in a weight ratio of 1:1 instead of A and B1. The resin blend had a weight-average molecular weight of 5500.

The results of the evaluation tests for the thus prepared photoresist composition are shown in Table 1 below.

Comparative Example 2

The procedures for the preparation of the photoresist composition and evaluation tests thereof were substantially the same as in Example I except that the resin blend was prepared from the Resins D and F in a weight ratio of 1:1 instead of A and B1. The resin blend had a weight-average molecular weight of 6200.

The results of the evaluation tests for the thus prepared photoresist composition are shown in Table 1 below.

Comparative Example 3

The procedures for the preparation of the photoresist composition and evaluation tests thereof were substantially the same as in Example 1 except that the resin blend was prepared from the Resins D and G in a weight ratio of 1:1 instead of A and B1. The resin blend had a weight-average molecular weight of 7800.

The results of the evaluation tests for the thus prepared photoresist composition are shown in Table 1 below.

Comparative Example 4

The procedures for the preparation of the photoresist composition and evaluation tests thereof were substantially the same as in Example 1 except that the resin blend was prepared from the Resins D and I in a weight ratio of 1:1 instead of A and B1. The resin blend had a weight-average molecular weight of 8100.

The results of the evaluation tests for the thus prepared photoresist composition are shown in Table 1 below.

Comparative Example 5

The procedures for the preparation of the photoresist composition and evaluation tests thereof were substantially the same as in Example 1 except that the resin blend was prepared from the Resins G and H in a weight ratio of 1:1 instead of A and B1 and replacement of PAC1 and PHC1 each with the same amount of PAC2 and PHC2, respectively. The resin blend had a weight-average molecular weight of 12000.

The results of the evaluation tests for the thus prepared photoresist composition are shown in Table 1 below.

Comparative Example 6

The procedures for the preparation of the photoresist composition and evaluation tests thereof were substantially the same as in Example 1 except that the resin blend was prepared from the Resins G and I in a weight ratio of 1:1 instead of A and B1 and replacement of PAC1 and PHC1 each with the same amount of PAC2 and PHC2, respectively. The resin blend had a weight-average molecular weight of 12400.

The results of the evaluation tests for the thus prepared photoresist composition are shown in Table 1 below.

Comparative Example 7

The procedures for the preparation of the photoresist composition and evaluation tests thereof were substantially the same as in Example 1 except that the resin blend was prepared from the Resins D, G and I in a weight ratio of 1:1:1 instead of A and B1 and replacement of PAC1 and PHC1 each with the same amount of PAC2 and PHC2, respectively. The resin blend had a weight-average molecular weight of 8300.

The results of the evaluation tests for the thus prepared photoresist composition are shown in Table 1 below.

TABLE 1

| | Photo-sensitivity, ms | Resolution, μm | Heat resistance, °C | Cross sectional profile | Focusing depth latitude, μm (a) | (b) |
|---|---|---|---|---|---|---|
| Example | | | | | | |
| 1 | 210 | 0.45 | 140 | A | 1.6 | 2.1 |
| 2 | 220 | 0.45 | 140 | A | 1.6 | 2.1 |
| 3 | 200 | 0.50 | 140 | B | 1.6 | 2.1 |
| 4 | 270 | 0.40 | 130 | A | 1.8 | 2.3 |
| 5 | 260 | 0.40 | 135 | A | 1.8 | 2.3 |
| 6 | 230 | 0.50 | 135 | B | 1.6 | 2.1 |
| 7 | 240 | 0.45 | 135 | A | 1.8 | 2.3 |
| 8 | 250 | 0.40 | 135 | A | 1.8 | 2.3 |
| Comparative Example | | | | | | |
| 1 | 400 | 0.60 | 130 | B | — | 1.2 |
| 2 | 420 | 0.60 | 130 | B | — | 1.2 |
| 3 | 350 | 0.65 | 135 | B | — | 1.0 |
| 4 | 380 | 0.65 | 135 | B | — | 1.0 |
| 5 | 300 | 0.70 | 140 | C | — | 0.8 |
| 6 | 320 | 0.70 | 140 | C | — | 0.8 |
| 7 | 330 | 0.70 | 135 | C | — | 0.8 |

What is claimed is:

1. A positive-working photoresist composition which comprises, as a uniform mixture:
    (A) an alkali-soluble resinous ingredient as a film-forming agent; and
    (B) a quinone diazide group-containing compound as a photo-sensitizing agent,
    said alkali-soluble resinous ingredient being a combination of at least two kinds of alkali-soluble novolac resins selected from the group consisting of:
      (a) a first novolac resin which is a condensation product of a mixture of phenolic compounds consisting of from 35 to 48% by moles of m-cresol and from 52 to 65% by moles of p-cresol with an aldehyde compound and has a weight-average molecular weight in the range from 2100 to 3800 as prepared;
      (b1) a second novolac resin which is a condensation product of a mixture of phenolic compounds consisting of from 50 to 70% by moles of m-cresol and from 30 to 50% by moles of a xylenol with an aldehyde compound and has a weight-average molecular weight in the range from 2100 to 3800 as prepared; and
      (c1) a third novolac resin which is a condensation product of a mixture of phenolic compounds consisting of from 60 to 80% by moles of m-cresol and from 20 to 40% by moles of a trimethyl phenol with an aldehyde compound and has a weight-average molecular weight in the range from 2100 to 3800 as prepared
    said combination of at least two kinds of the alkali-soluble novolac resins as a whole having a weight-average molecular weight in the range from 3000 to 7000 after removal of the low molecular-weight fractions.

2. The positive-working photoresist composition as claimed in claim 1 in which the combination of the alkali-soluble novolac resins is a combination of from 40 to 70 parts by weight of the novolac resin (a) and from 60 to 30 parts by weight of the novolac resin (b1).

3. The positive-working photoresist composition as claimed in claim 1 in which the combination of the alkali-soluble novolac resins is a combination of from 20 to 60 parts by weight of the novolac resin (a) and from 80 to 40 parts by weight of the novolac resin (c1).

4. The positive-working photoresist composition as claimed in claim 1 in which the combination of the alkali-soluble novolac resins is a combination of from 20 to 50 parts by weight of the novolac resin (b1) and from 80 to 50 parts by weight of the novolac resin (c1).

5. The positive-working photoresist composition as claimed in claim 1 in which the combination of the alkali-soluble novolac resins is a combination of from 20 to 70 parts by weight of the novolac resin (a), from 10 to 30 parts by weight of the novolac resin (b1) and from 20 to 50 parts by weight of the novolac resin (c1), the total amount being 100 parts by weight.

6. The positive-working photoresist composition as claimed in claim 2 in which the molar fraction of the xylenol moiety in the overall phenolic moiety in the combination of the novolac resins is in the range from 3 to 20%.

7. The positive-working photoresist composition as claimed in claim 3 in which the molar fraction of the trimethyl phenol moiety in the overall phenolic moiety in the combination of the novolac resins is in the range from 3 to 16%.

8. The positive-working photoresist composition as claimed in claim 4 in which the molar fractions of the xylenol moiety and the trimethyl phenol moiety in the overall phenolic moiety in the combination of the novolac resins are in the range from 2 to 16% and in the range from 2 to 13%, respectively.

9. The positive-working photoresist composition as claimed in claim 5 in which the molar fractions of the xylenol moiety and the trimethyl phenol moiety in the overall phenolic moiety in the combination of the novolac resins are in the range from 2 to 16% and in the range from 2 to 13%, respectively.

10. The positive-working photoresist composition as claimed in claim 1 in which the amount of the component (B) is in the range from 5 to 100% by weight based on the amount of the component (A).

11. A positive-working photoresist composition which comprises, as a uniform mixture:

(A) an alkali-soluble resinous ingredient as a film-forming agent; and (B) a quinone diazide group-containing compound as a photo-sensitizing agent, said alkali-soluble resinous ingredient being a combination of at least two kinds of alkali-soluble novolac resins selected from the group consisting of:

(a) a first novolac resin which is a condensation product of a mixture of phenolic compounds consisting of from 35 to 48% by moles of m-cresol and from 52 to 65% by moles of p-cresol with an aldehyde compound and has a weight-average molecular weight in the range from 2100 to 3800 as prepared;

(b2) a second novolac resin which is a condensation product of a mixture of phenolic compounds consisting of from 35 to 50% by moles of m-cresol, from 25 to 35% by moles of a xylenol and from 15 to 40% by moles of p-cresol with an aldehyde compound and has a weight-average molecular weight in the range from 2100 to 3800 as prepared; and (c1) a third novolac resin which is a condensation product of a mixture of phenolic compounds consisting of from 60 to 80% by moles of m-cresol and from 20 to 40% by moles of a trimethyl phenol with an aldehyde compound and has a weight-average molecular weight in the range from 2100 to 3800 as prepared, said combination of at least two kinds of the alkali-soluble novolac resins as a whole having a weight-average molecular weight in the range from 3000 to 7000 after removal of the low molecular-weight fractions.

12. The positive-working photoresist composition as claimed in claim 11 in which the combination of the alkali-soluble novolac resins is a combination of from 40 to 70 parts by weight of the novolac resin (a) and from 60 to 30 parts by weight of the novolac resin (b2).

13. The positive-working photoresist composition as claimed in claim 11 in which the combination of the alkali-soluble novolac resins is a combination of from 20 to 60 parts by weight of the novolac resin (a) and from 80 to 40 parts by weight of the novolac resin (c1).

14. The positive-working photoresist composition as claimed in claim 11 in which the combination of the alkali-soluble novolac resins is a combination of from 20 to 50 parts by weight of the novolac resin (b2) and from 80 to 50 parts by weight of the novolac resin (c1).

15. The positive-working photoresist composition as claimed in claim 11 in which the combination of the alkali-soluble novolac resins is a combination of from 20 to 70 parts by weight of the novolac resin (a), from 10 to 30 parts by weight of the novolac resin (b2) and from 20 to 50 parts by weight of the novolac resin (c1), the total amount being 100 parts by weight.

16. The positive-working photoresist composition as claimed in claim 12 in which the molar fraction of the xylenol moiety in the overall phenolic moiety in the combination of the novolac resins is in the range from 3 to 20%.

17. The positive-working photoresist composition as claimed in claim 13 in which the molar fraction of the trimethyl phenol moiety in the overall phenolic moiety in the combination of the novolac resins is in the range from 3 to 16%.

18. The positive-working photoresist composition as claimed in claim 14 in which the molar fractions of the xylenol moiety and the trimethyl phenol moiety in the overall phenolic moiety in the combination of the novolac resins are in the range from 2 to 16% and in the range from 2 to 13%, respectively.

19. The positive-working photoresist composition as claimed in claim 15 in which the molar fractions of the xylenol moiety and the trimethyl phenol moiety in the overall phenolic moiety in the combination of the novolac resins are in the range from 2 to 16% and in the range from 2 to 13%, respectively.

20. The positive-working photoresist composition as claimed in claim 11 in which the amount of the component (B) is in the range from 5 to 100% by weight based on the amount of the component (A).

21. A positive-working photoresist composition which comprises, as a uniform mixture:

(A) an alkali-soluble resinous ingredient as a film-forming agent; and (B) a quinone diazide group-containing compound as a photo-sensitizing agent, said alkali-soluble resinous ingredient being a combination of at least two kinds of alkali-soluble novolac resins selected from the group consisting of:

(a) a first novolac resin which is a condensation product of a mixture of phenolic compounds consisting of from 35 to 48% by moles of m-cresol and from 52 to 65% by moles of p-cresol with an aldehyde compound and has a weight-average molecular weight in the range from 2100 to 3800 as prepared;

(b1) a second novolac resin which is a condensation product of a mixture of phenolic compounds consisting of from 50 to 70% by moles of m-cresol and from 30 to 50% by moles of a xylenol with an aldehyde compound and has a weight-average molecular weight in the range from 2100 to 3800 as prepared; and (c2) a third novolac resin which is a condensation product of a mixture of phenolic compounds consisting of from 30 to 50% by moles of m-cresol, from 10 to 30% by moles of a trimethyl phenol and from 20 to 60% by moles of p-cresol with an aldehyde compound and has a weight-average molecular weight in the range from 2100 to 3800 as prepared, said combination of at least two kinds of the alkali-soluble novolac resins as a whole having a weight-average molecular weight in the range from 3000 to 7000 after removal of the low molecular-weight fractions.

22. The positive-working photoresist composition as claimed in claim 21 in which the combination of the alkali-soluble novolac resins is a combination of from 40 to 70 parts by weight of the novolac resin (a) and from 60 to 30 parts by weight of the novolac resin (b1).

23. The positive-working photoresist composition as claimed in claim 21 in which the combination of the alkali-soluble novolac resins is a combination of from 20 to 60 parts by weight of the novolac resin (a) and from 80 to 40 parts by weight of the novolac resin (c2).

24. The positive-working photoresist composition as claimed in claim 21 in which the combination of the alkali-soluble novolac resins is a combination of from 20 to 50 parts by weight of the novolac resin (bl) and from 80 to 50 parts by weight of the novolac resin (c2).

25. The positive-working photoresist composition as claimed in claim 21 in which the combination of the alkali-soluble novolac resins is a combination of from 20 to 70 parts by weight of the novolac resin (a), from 10 to 30 parts by weight of the novolac resin (b1) and from 20 to 50 parts by weight of the novolac resin (c2), the total amount being 100 parts by weight.

26. The positive-working photoresist composition as claimed in claim 22 in which the molar fraction of the xylenol moiety in the overall phenolic moiety in the combination of the novolac resins is in the range from 3 to 20%.

27. The positive-working photoresist composition as claimed in claim 23 in which the molar fraction of the trimethyl phenol moiety in the overall phenolic moiety in the combination of the novolac resins is in the range from 3 to 16%.

28. The positive-working photoresist composition as claimed in claim 24 in which the molar fractions of the xylenol moiety and the trimethyl phenol moiety in the overall phenolic moiety in the combination of the novolac resins are in the range from 2 to 16% and in the range from 2 to 13%, respectively.

29. The positive-working photoresist composition as claimed in claim 25 in which the molar fractions of the xylenol moiety and the trimethyl phenol moiety in the overall phenolic moiety in the combination of the novolac resins are in the range from 2 to 16% and in the range from 2 to 13%, respectively.

30. The positive-working photoresist composition as claimed in claim 21 in which the amount of the component (B) is in the range from 5 to 100% by weight based on the amount of the component (A).

31. A positive-working photoresist composition which comprises, as a uniform mixture:

(A) an alkali-soluble resinous ingredient as a film-forming agent; and (B) a quinone diazide group-containing compound as a photo-sensitizing agent, said alkali-soluble resinous ingredient being a combination of at least two kinds of alkali-soluble novolac resins selected from the group consisting of:

(a) a first novolac resin which is a condensation product of a mixture of phenolic compounds consisting of from 35 to 48% by moles of m-cresol and from 52 to 65% by moles of p-cresol with an aldehyde compound and has a weight-average molecular weight in the range from 2100 to 3800 as prepared;

(b2) a second novolac resin which is a condensation product of a mixture of phenolic compounds consisting of from 35 to 50% by moles of m-cresol, from 25 to 35% by moles of a xylenol and from 15 to 40% by moles of p-cresol with an aldehyde compound and has a weight-average molecular weight in the range from 2100 to 3800 as prepared; and (c2) a third novolac resin which is a condensation product of a mixture of phenolic compounds consisting of from 30 to 50% by moles of m-cresol, from 10 to 30% by moles of a trimethyl phenol and from 20 to 60% by moles of p-cresol with an aldehyde compound and has a weight-average molecular weight in the range from 2100 to 3800 as prepared, said combination of at least two kinds of the alkali-soluble novolac resins as a whole having a weight-average molecular weight in the range from 3000 to 7000 after removal of the low molecular-weight fractions.

32. The positive-working photoresist composition as claimed in claim 31 in which the combination of the alkali-soluble novolac resins is a combination of from 40 to 70 parts by weight of the novolac resin (a) and from 60 to 30 parts by weight of the novolac resin (b2).

33. The positive-working photoresist composition as claimed in claim 31 in which the combination of the alkali-soluble novolac resins is a combination of from 20 to 60 parts by weight of the novolac resin (a) and from 80 to 40 parts by weight of the novolac resin (c2).

34. The positive-working photoresist composition as claimed in claim 31 in which the combination of the alkali-soluble novolac resins is a combination of from 20 to 50 parts by weight of the novolac resin (b2) and from 80 to 50 parts by weight of the novolac resin (c2).

35. The positive-working photoresist composition as claimed in claim 31 in which the combination of the alkali-soluble novolac resins is a combination of from 20 to 70 parts by weight of the novolac resin (a), from 10 to 30 parts by weight of the novolac resin (b2) and from 20 to 50 parts by weight of the novolac resin (c2), the total amount being 100 parts by weight.

36. The positive-working photoresist composition as claimed in claim 32 in which the molar fraction of the xylenol moiety in the overall phenolic moiety in the combination of the novolac resins is in the range from 3 to 20%.

37. The positive-working photoresist composition as claimed in claim 33 in which the molar fraction of the trimethyl phenol moiety in the overall phenolic moiety in the combination of the novolac resins is in the range from 3 to 16%.

38. The positive-working photoresist composition as claimed in claim 34 in which the molar fractions of the xylenol moiety and the trimethyl phenol moiety in the overall phenolic moiety in the combination of the novolac resins are in the range from 2 to 16% and in the range from 2 to 13%, respectively.

39. The positive-working photoresist composition as claimed in claim 35 in which the molar fractions of the xylenol moiety and the trimethyl phenol moiety in the overall phenolic moiety in the combination of the novolac resins are in the range from 2 to 16% and in the range from 2 to 13%, respectively.

40. The positive-working photoresist composition as claimed in claim 31 in which the amount of the component (B) is in the range from 5 to 100% by weight based on the amount of the component (A).

41. The positive-working photoresist composition according to claim 1 in which the aldehyde used in the preparation of novolac resins (a), (b1) and (c1) is formaldehyde.

42. The positive-working photoresist composition according to claim 11 in which the aldehyde compound used in the preparation of the novolac resins (a), (b2) and (c1) is formaldehyde.

43. The positive-working photoresist composition according to claim 21 in which the aldehyde compound used in the preparation of the novolac resins (a), (b1) and (c2) is formaldehyde.

44. The positive-working photoresist composition according to claim 31 in which the aldehyde compound used in the preparation of the novolac resins (a), (b2) and (c2) is formaldehyde.

* * * * *